United States Patent [19]

Kumagai

[11] Patent Number: 4,667,330
[45] Date of Patent: May 19, 1987

[54] SEMICONDUCTOR MEMORY DEVICE

[75] Inventor: Yutaka Kumagai, Tokyo, Japan

[73] Assignee: Oki Electric Industry Co., Ltd., Tokyo, Japan

[21] Appl. No.: 903,205

[22] Filed: Sep. 2, 1986

Related U.S. Application Data

[63] Continuation of Ser. No. 596,812, Apr. 3, 1984, abandoned.

[30] Foreign Application Priority Data

Apr. 4, 1983 [JP] Japan .................... 58-58022

[51] Int. Cl.$^4$ ..................... G11C 29/00; G06F 11/00
[52] U.S. Cl. .......................... 371/71; 371/21; 371/24
[58] Field of Search ............. 371/21, 24, 71; 324/73 R, 73 AT

[56] References Cited

U.S. PATENT DOCUMENTS

| | | | |
|---|---|---|---|
| 3,096,511 | 7/1963 | Taras | 371/71 X |
| 3,768,071 | 10/1973 | Knauft et al. | 371/71 X |
| 3,924,181 | 12/1975 | Alderson | 324/73 R |
| 3,940,601 | 2/1976 | Henry et al. | 371/71 X |
| 4,045,779 | 8/1977 | Markle | 371/71 |
| 4,320,509 | 3/1982 | Davidson | 371/25 |
| 4,363,125 | 12/1982 | Brewer et al. | 371/71 |
| 4,365,332 | 12/1982 | Rice | 371/13 |

OTHER PUBLICATIONS

J. J. LeBlanc, LOCST: A Built-In Self-Test Technique, IEEE Design and Test, Nov. 1984, pp. 45-52.
E. F. Hahn et al., VLSI Testing by On-Chip Error Detection, IBM Technical Disclosure Bulletin, vol. 25, No. 2, Jul. 1982, p. 709.
P. P. Fasang, Circuit Module Implements Practical Self-Testing, Electronics, May 19, 1982, pp. 164-167.
T. W. Williams, High-Speed Low-Volume Data Array Self-Test, IBM Technical Disclosure Bulletin.

*Primary Examiner*—Charles E. Atkinson
*Attorney, Agent, or Firm*—Martin M. Novack

[57] ABSTRACT

A semiconductor memory chip which has not only a memory array together with address decoding means, but also a self diagnosis means which functions to indicate a defective cell of said memory array has been found. Said self diagnosis means is mounted on the same chip as that of the memory array, and has means for storing information to be stored in the memory array, and means for comparing content of said storing means with output information which is read out of the address at which the information is stored. When the two data do not coincide with each other, an error signal indicating a defective cell in the memory array at the selected address is output.

2 Claims, 13 Drawing Figures

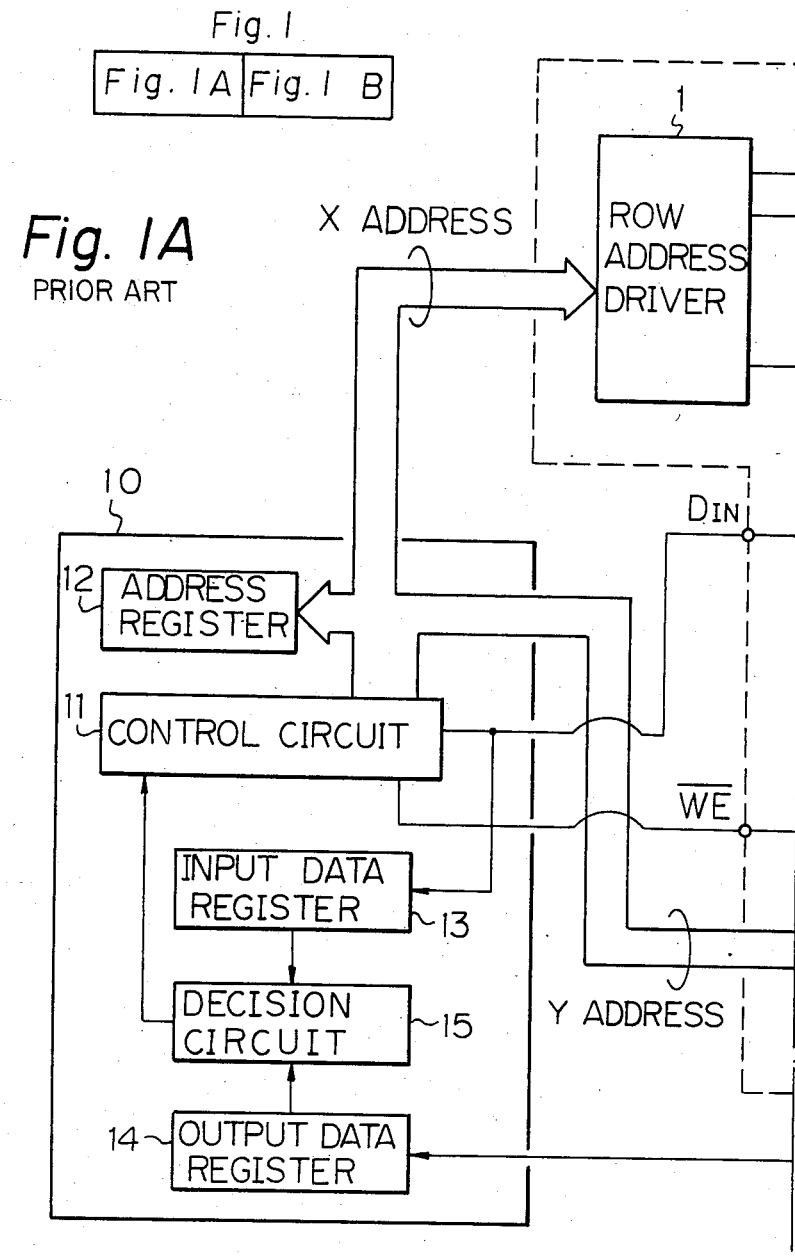

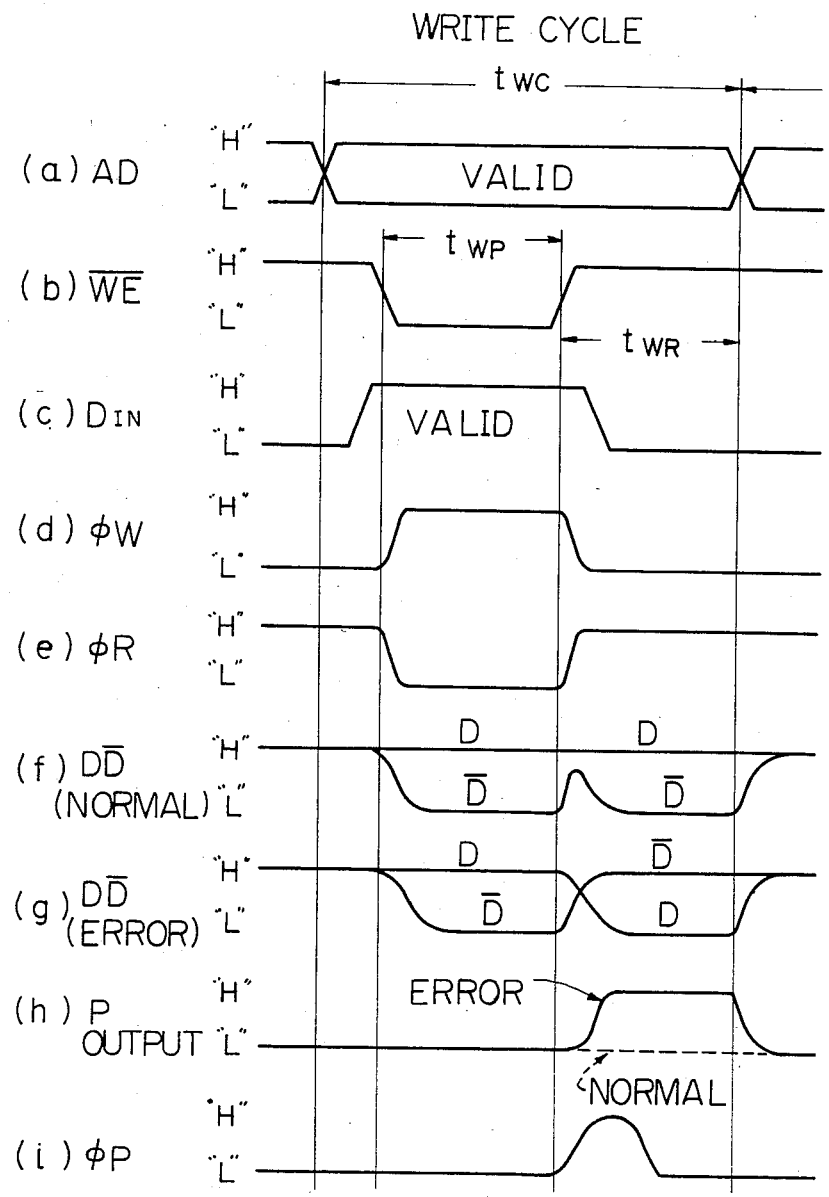

SEMICONDUCTOR MEMORY DEVICE

This is a continuation of U.S. application Ser. No. 596,812 filed Apr. 3, 1984 now abandoned.

BACKGROUND OF THE INVENTION

The present invention relates to a semiconductor memory device and, in particular, relates to such a memory device which has a self diagnosis function.

A large capacity semiconductor memory device, for instance, 256 kbit static memory, and 1 Mbit dynamic memory, has recently been developed and reflects the development of the semiconductor producing process. However, due to the complicated structure and the large scale of a memory array in a semiconductor memory device, it has been difficult to manufacture a semiconductor memory device which has no defective cells.

If a complete semiconductor memory device which has no defective cells is desired, the yield rate of the semiconductor memory device decreases considerably, and therefore, the manufacturing cost would increase.

Accordingly, a semiconductor memory device which has partially defective cells (Partially good memory (PGM), or Mostly good memory (MGM)) have been used to reduce the cost of an electronic system.

Conventionally, each memory cell of a semiconductor memory device is measured beforehand, and the address of a defective cell is memorized in an external CPU control unit of a system, which is programmed so that the address of the defective cell is not used.

FIG. 1 is a block diagram of a prior electronic system in which a semiconductor memory with some defective cells is used.

In the figure, a memory IC chip 16 has a row address driver 1, a row address decoder 2, a memory array 3 which might have some defective cells, a column address driver 4, a column address decoder 5, a multiplexer 6, a data input circuit 7, a data output circuit 8, and a write enabling circuit 9. A CPU memory control circuit 10 has a control circuit 11, an address register 12, an input data register 13, an output data register 14, and a decision circuit 15. Said CPU memory control circuit 10 accomplishes the recognition of a defective cell in a memory chip 16 (step 1) by comparing input data with output data of the selected cell, to store an address of the defective cell (step 2), and writing and/or reading an information in or from a normal cell (step 3).

The input data register 13 in the memory control circuit 10 stores input information to the memory array 3. In reading phase of a memory, when the control circuit 11 selects an address of the memory array 3, the input data register 13 stores a correct input data which is to be stored in said selected address, and simultaneously, the output data register 14 stores the output data $D_{OUT}$ of the selected address cell.

The decision circuit 15 compares the content of the input data register 13 with the content of the output data register 14, and when those two data do not coincide with each other, the selected address at that time is recognized as a defective address, and said address is stored in the address register 12. The memory chip 16 is used so that the defective address stored in the address register 12 is not accessed.

However, the conventional system in FIG. 1 has the disadvantages that the software or program for recognizing a defective cell in the external CPU memory control circuit 10 is very complicated, and its takes long time to recognize a defective address since the cell must be read out by an external CPU. Accordingly, the reduction of the cost of an electronic system has been impossible although a memory cell with some defective cells has been used.

SUMMARY OF THE INVENTION

It is an object, therefore, of the present invention to overcome the disadvantages and limitations of a prior semiconductor memory device by providing a new and improved semiconductor memory device.

It is also an object of the present invention to provide a semiconductor memory device which has means for detecting a defective cell.

Another object of the present invention to provide a semiconductor memory device which has a self diagnosis means provided on the same chip as that of a memory array for detecting a defective cell.

Still another object of the present invention is to provide a semiconductor memory device which provides a low cost electronic apparatus.

The above and other objects are attained by a semiconductor memory device comprising; a memory array having a plurality of memory cells arranged in matrix; a data line coupled with said memory array through switching means which is provided for each column of the matrix of said memory array; a data input circuit coupled with said data line for writing information in a selected memory cell in said memory array; a data output circuit coupled with said data line to read out information from a selected memory cell in said memory array; wherein a self diagnosis means coupled with said data line is provided; said self diagnosis means stores information to be stored in a selected memory cell in said memory array; said information stored in said selected memory cell is read out just after it is written from said selected memory cell and is applied to said self diagnosis means; said self diagnosis means compares data read out of the memory cell with data to be stored, and provides a signal indicating presence of a defective cell when the result of said comparison shows an error.

BRIEF DESCRIPTION OF THE DRAWINGS

The foregoing and other objects, features, and attendant advantages of the present invention will be appreciated as the same become better understood by means of the following description and accompanying drawings wherein;

FIG. 1 which includes FIGS. 1A and 1B, is a block diagram of a prior system having a semiconductor memory device with some error cells, and a memory control circuit, FIG. 2 which includes

DESCRIPTION OF THE PREFERRED EMBODIMENTS

Figure 1B:
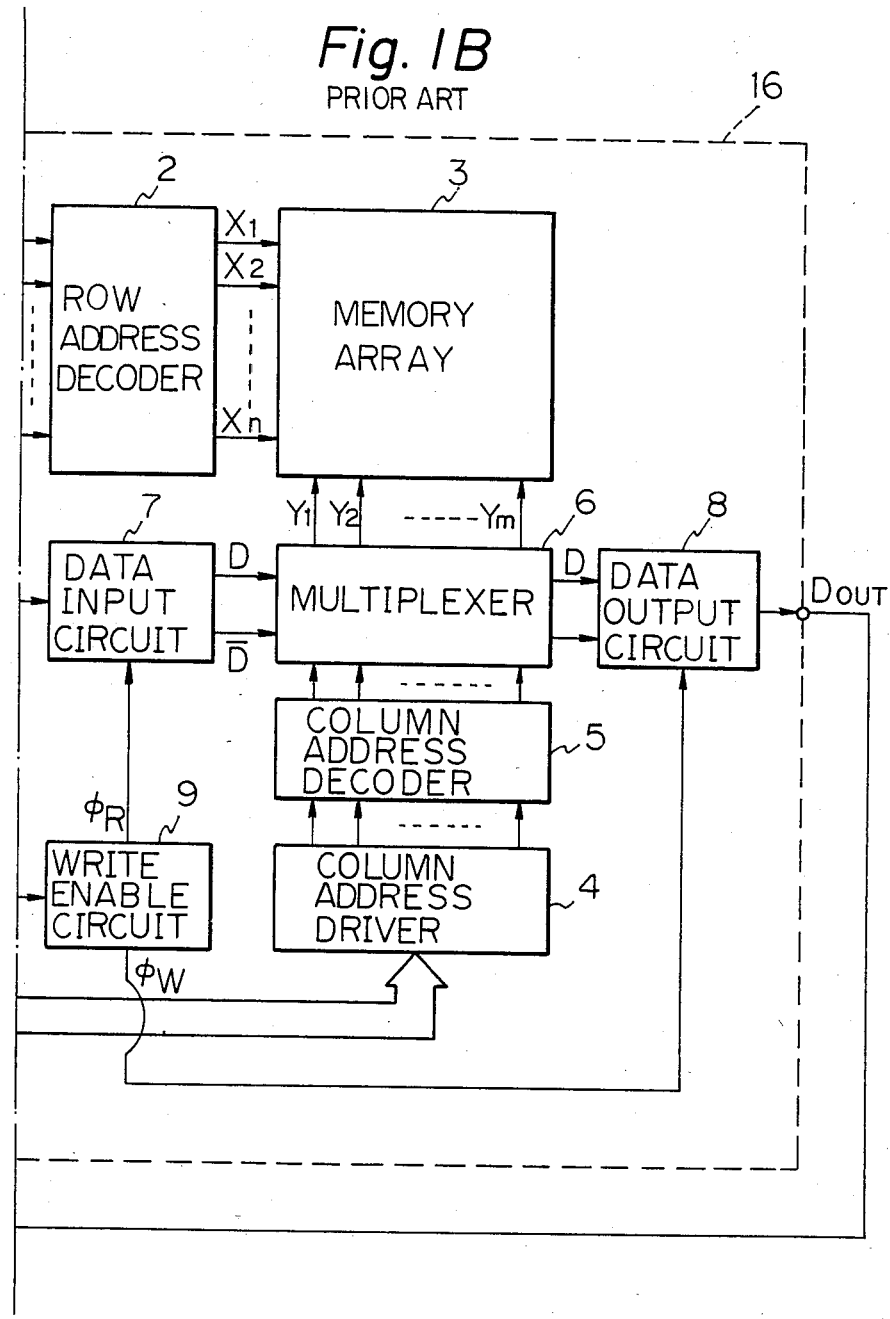
Figure 2A:
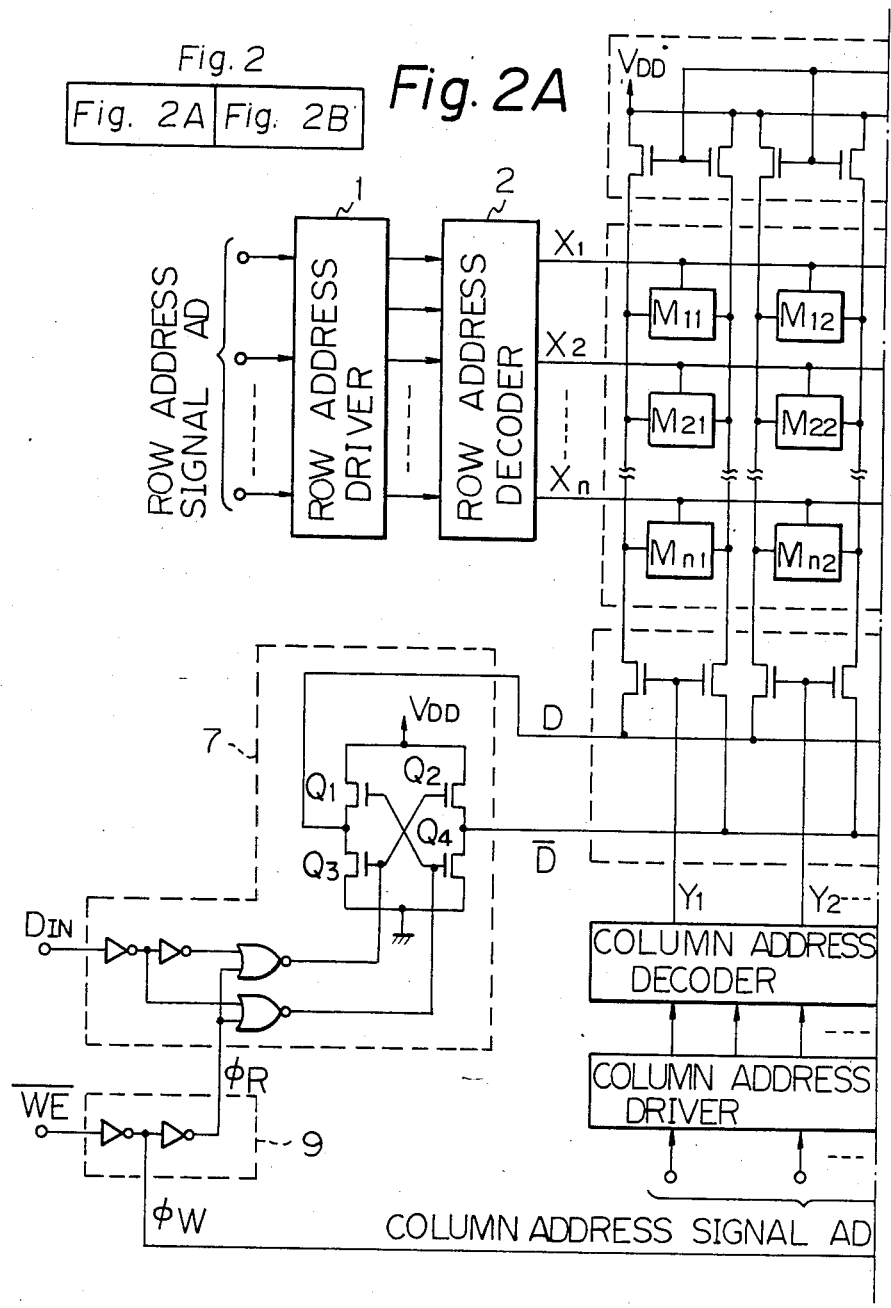
FIGS. 2A and 2B, is a block diagram of the static semiconductor memory device which has a self diagnosis circuit according to the present invention, and which includes graphs (a) through (i) the operational timing sequence of the semiconductor memory device in FIG. 2.
Figure 2B:
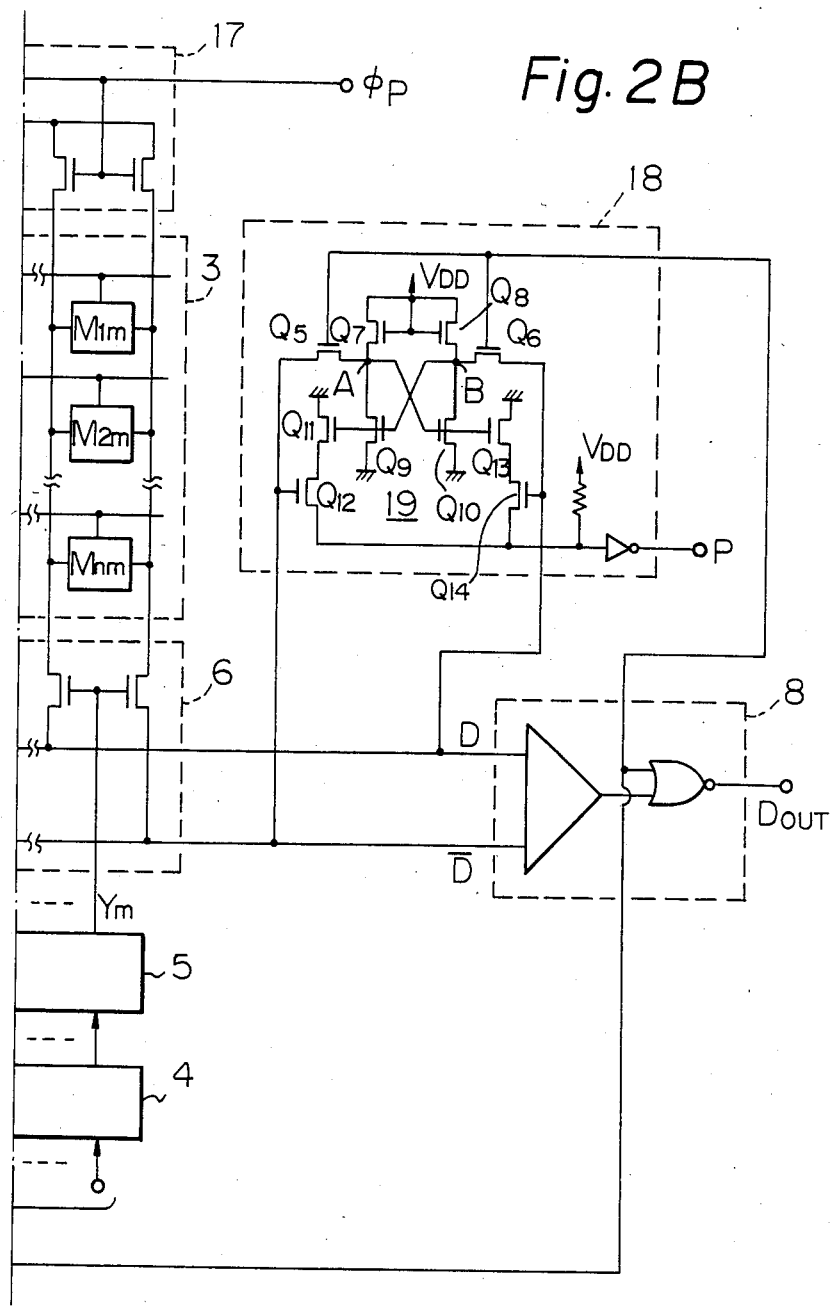

FIG. 2 shows the embodiment of the static semiconductor memory chip according to the present invention. In the figure, the numeral 1 is a row address driver which receives an external row address input signal AD, and provides a pair of internal address signals A and $\overline{A}$, 2 is a row address decoder which selects one of the word lines $X_1$ and $X_n$ according to said internal row address signals A and $\overline{A}$, 3 is a memory array having n (rows) x m (columns) number of cells. The numeral 4 is a column address driver which provides a pair of internal address signals B and $\overline{B}$ according to an external column address input signal, 5 is a column address decoder for selecting one of bit lines $Y_1$ through $Y_m$ according to said internal column address signals B and $\overline{B}$, and 6 is a multiplexer for providing a data signal from the memory cell to the data lines D and $\overline{D}$ according to the output signal of the column address decoder 5.

The numeral 9 is an enable control circuit for providing the write control signal $\phi_W$ and read control signal $\phi_R$ according to the write enable signal $\overline{WE}$, the numeral 8 is a data output circuit for providing a memory cell information of the data lines D and $\overline{D}$ to the data output terminal $D_{OUT}$ according to the write control signal $\phi_W$, the numeral 7 is the data input circuit for providing data input signal $D_{IN}$ selectively to the data lines D and $\overline{D}$ according to the read control signal $\phi_R$, and the numeral 17 is a pre-charge circuit for charging all the bit lines of the memory array 3 to the source potential $V_{DD}$ according to the pre-charge signal $\phi_P$.

It is assumed that the memory array 3 has a defective cell, for instance, it is assumed that the cell $M_{22}$ is defective.

The data input circuit 7 has a buffer circuit which has the MOS transistors $Q_1$ through $Q_4$, an inverter, and NOR logic circuits.

The data output circuit 8 has an amplifier, and a NOR logic circuit.

The enable control circuit 9 has a pair of series connected inverters.

The present semiconductor memory has further a self diagnosis circuit 18 which provides an error signal when the signal on the data lines D and $\overline{D}$ is different from the original signal to be stored. Said signal on the data lines D and $\overline{D}$ is read out of the memory cell just after said signal is stored in said cell by the write control signal $\phi_W$. The self diagnosis circuit 18 is composed, for instance, of an associate memory circuit comprising a memory circuit 19 with MOS transistors $Q_7$, $Q_8$, $Q_9$ and $Q_{10}$, the switching transistors $Q_5$ and $Q_6$ for applying signal on the data lines D and $\overline{D}$ to said memory circuit by the write control signal $\phi_W$, the MOS transistors $Q_{11}$ and $Q_{12}$ which are controlled by the potential at the node B and the potential on the data line $\overline{D}$, and the MOS transistors $Q_{13}$ and $Q_{14}$ which are controlled by the potential at the node A and the potential at the data line D, and the inverter.

The operation of the present semiconductor memory device is described in accordance with FIG. 3. It is assumed tht the row address signal and the column address signal in the write period $t_{wc}$ selects the normal cell $M_{11}$ by the word line $X_1$ and the bit line $Y_1$, and the pre-charge signal $\phi_p$ is in the low (L) level. The write enable signal $\overline{WE}$ at that time is in high (H) level, then, the control signals $\phi_W$ and $\phi_R$ are in (L) and (H) level, respectively, and the data output lines D and $\overline{D}$ of the data input circuit 7 are both in (H) level (see FIGS. 3(b), 3(d), 3(e) and 3(f)). Accordingly, the data output circuit 8 is prohibited to provide an output signal, and the MOS transistors $Q_5$ and $Q_6$ in the self diagnosis circuit 18 are in OFF state.

Next, when the write enable signal $\overline{WE}$ becomes (L) level in the period $t_{wp}$, the data input signal $D_{IN}$ (which is assumed to be in (H) level) is applied to the data input circuit 7, and the data lines D and $\overline{D}$ become (H) and (L) levels, respectively, and the information on those data lines D and $\overline{D}$ is stored in the memory cell $M_{11}$ (see FIG. 3(f)). Further, the MOS transistors $Q_5$ and $Q_6$ in the self diagnosis circuit 18 ga to an ON state, then, the information on the data lines D and $\overline{D}$ is stored in the memory circuit 19. It should be noted that the transistors $Q_{11}$ and $Q_{12}$ are in ON and OFF states, respectively, and the transistors $Q_{13}$ and $Q_{14}$ are in OFF and ON states, respectively.

Accordingly, the output terminal P of the circuit 18 provides the L level output signal.

Next, the write enable signal $\overline{WE}$ changes to H level, and the pre-charge signal $\phi_P$ changes to H level, the content of the memory cell $M_{11}$ is immediately provided to the data lines D and $\overline{D}$, and the MOS transistors $Q_5$ and $Q_6$ become OFF state. Since it is assumed that the memory cell $M_{11}$ is normal, the data lines D and $\overline{D}$ are in H and L states, respectively. Accordingly, the MOS transistors $Q_{12}$ and $Q_{14}$ are in OFF and ON states, respectively, and the output terminal P of the self diagnosis circuit 18 holds L level, which indicates that the cell is normal.

Next, it is assumed that the memory cell $M_{22}$ (which is in error) is selected by the word line $X_2$ and the bit line $Y_2$ by the row address signal and the column address signal in the write period $t_{wc}$, and the pre-charge signal $\phi_p$ is in L level. The write enable signal $\overline{WE}$ is in H level at that time, then, the control signals $\phi_W$ and $\phi_R$ are in L and H levels, respectively, and the data output lines D and $\overline{D}$ in the data input circuit 7 are in H level (see FIGS. 3(b), 3(d), 3(e) and 3(f)). Accordingly, the data output circuit 8 is prohibited to provide an output signal, and the MOS transistors $Q_5$ and $Q_6$ in the self diagnosis circuit 18 are in OFF state.

Next, when the write enable signal $\overline{WE}$ becomes L level in the period $t_{wp}$, the data input signal $D_{IN}$ (which is for instance in L level) is applied to the data input circuit 7, and the data lines D and $\overline{D}$ become H and L level, respectively, and the information on those data lines D and $\overline{D}$ is stored in the memory cell $M_{22}$ (see FIG. 3(f)).

Simultaneously, the MOS transistors $Q_5$ and $Q_6$ in the self diagnosis circuit 18 become ON state, then, the information of the data lines D and $\overline{D}$ is stored in the memory circuit 19. At that time, the transistors $Q_{11}$ and $Q_{12}$ are in ON and OFF states, respectively, and the transistors $Q_{13}$ and $Q_{14}$ are in OFF and ON states, respectively. Accordingly, the output terminal P provides the L level output signal.

Next, when the write enable signal $\overline{WE}$ changes to H level, and the pre-charge signal $\phi_p$ changes to H level, the content of the memory cell $M_{22}$ is immediately read out and is provided to the data lines D and $\overline{D}$, and the MOS transistors $Q_5$ and $Q_6$ become to the OFF state.

Since it is assumed that there is something wrong with the memory cell $M_{22}$, the data lines D and $\overline{D}$ are in L and H level, respectively. Accordingly, the MOS transistors $Q_{12}$ and $Q_{14}$ are in ON and OFF state, respectively, and the output signal at the output terminal P changes from L level to H level. That change of the output terminal P indicates the error of a memory cell. Therefore, when a defective cell exists, the fact of the presence of the defective cell is measured when information is written in that defective cell.

As described above, the present semiconductor memory device has a self diagnosis circuit 18 which measures if the signal is correctly stored in the cell in the rear portion of each write period, an external memory control circuit is not needed to recognize a defective cell. Accordingly, a memory control circuit which has a stored program is simplified, and the operation to switching from a defective cell to a normal cell is accomplished quickly.

Accordingly, the operation of a memory control circuit is not complicated even when some of memory cells are defective, and therefore, the total cost including both a memory device and a memory control circuit is reduced.

Although the present invention is described for the embodiment of a static semiconductor memory, the present invention is also applicable to a large capacity of dynamic semiconductor memory, and/or a memory circuit in a microprocessor and LSI circuit.

From the foregoing, it will now be apparent that a new and improved semiconductor memory device has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. A semiconductor memory device comprising:

a semiconductor memory array having a plurality of memory cells arranged in a matrix for storing data in response to an external write enable signal;

a data line coupled with said memory array through switching means which transfers data on said data line to and from said memory array;

a data input circuit coupled with said data line for writing information in a selected memory cell in said memory array;

a data output circuit coupled with said data line for coupling information read out of a selected memory cell to an output;

such that said data line is utilized for both writing information into said array during a memory write cycle, and reading information from said array during a memory read cycle;

wherein the improvement comprises;

a self-diagnosis means also coupled with said data line and having a storage means for storing during an early portion of said write cycle the data on said data line which is also stored in a selected memory cell of said memory array; and a comparison means for comparing, after the data is no longer applied to said memory cell and during a later portion of said write cycle, data out of said selected memory cell with the data that was stored in said storage means during said early portion of said write cycle; whereby when said data for the selected memory cell does not coincide with the data stored in said storage means, said self-diagnosis means provides an error signal.

2. A semiconductor memory device according to claim 1, wherein said self diagnosis means comprises an associative memory.

* * * * *